US005435060A

United States Patent [19]

Hayes et al.

[11] Patent Number: 5,435,060
[45] Date of Patent: Jul. 25, 1995

[54] METHOD OF MANUFACTURING A SINGLE SIDE DRIVE SYSTEM INTERCONNECTABLE INK JET PRINTHEAD

[75] Inventors: Donald J. Hayes, Plano; James L. Stortz, Spring, both of Tex.

[73] Assignee: Compaq Computer Corporation, Houston, Tex.

[21] Appl. No.: 66,396

[22] Filed: May 20, 1993

[51] Int. Cl.$^6$ .......... H01L 41/22; B41J 2/16
[52] U.S. Cl. .......... 29/890.1; 29/25.35
[58] Field of Search .......... 29/25.35, 890.1, 837; 310/348; 346/140.1, 141; 347/71, 72

[56] References Cited

U.S. PATENT DOCUMENTS

| | | | |
|---|---|---|---|
| 4,301,585 | 11/1981 | Ikeda | 29/890.1 |
| 5,212,115 | 5/1993 | Cho et al. | 29/25.35 X |
| 5,327,627 | 7/1994 | Ochiai et al. | 29/25.35 |

FOREIGN PATENT DOCUMENTS

| | | | |
|---|---|---|---|
| 0484983 | 5/1992 | European Pat. Off. . | |
| 0505188 | 9/1992 | European Pat. Off. . | |
| 535685 | 4/1993 | European Pat. Off. | 29/890.1 |
| 2770557 | 11/1990 | Japan | 29/890.1 |
| 596748 | 4/1993 | Japan | 29/890.1 |
| 5254130 | 10/1993 | Japan | 29/890.1 |
| 9111833 | 8/1991 | WIPO . | |

OTHER PUBLICATIONS

Patent Abstracts of Japan, vol. 13, No. 325, Jul. 21, 1989 (JP1091495).

*Primary Examiner*—Peter Dungba Vo
*Attorney, Agent, or Firm*—Konneker & Bush

[57] ABSTRACT

A single side interconnectable ink jet printhead and an associated method for manufacturing the same. The ink jet printhead includes a lower body portion having a plurality of conductive sections mounted to a top side of the lower body portion and a corresponding plurality of conductive pins projecting from a bottom side of the lower body portion. Each of the conductive sections is electrically connected to the corresponding one of the conductive pins. A bottom side surface of each one of a plurality of generally parallel, longitudinally extending first intermediate body portions, each formed of an active piezoelectric material poled in a first direction parallel to the top side surface of the lower body portion is conductively mounted to a portion of the top side surface of the lower body portion. A bottom side surface of each one of a plurality of generally parallel, longitudinally extending second intermediate body portions, each formed of an active piezoelectric material poled in a second direction opposite to the first direction is conductively mounted to a top side surface of a corresponding one of the first intermediate body portions and a bottom side surface of an insulative upper body portion is conductively mounted to a top side surface of each of the plurality of second intermediate body portions.

18 Claims, 6 Drawing Sheets

METHOD OF MANUFACTURING A SINGLE SIDE DRIVE SYSTEM INTERCONNECTABLE INK JET PRINTHEAD

BACKGROUND OF THE INVENTION

1. Field of the Invention

The present invention generally relates to ink jet printhead apparatus and, more particularly, to a method of manufacturing an ink jet printhead interconnectable with an associated drive system from a single side thereof.

1. Description of Related Art

A piezoelectrically actuated ink jet printhead is a relatively small device used to selectively eject tiny ink droplets onto a paper sheet operatively fed through a printer, in which the printhead is incorporated, to thereby form from the ejected ink droplets selected text and/or graphics on the sheet. In one representative configuration thereof, an ink jet printhead has a horizontally spaced parallel array of internal ink-receiving channels. These internal channels are covered at their front ends by a plate member through which a spaced series of small ink discharge orifices are formed. Each channel opens outwardly through a different one of the spaced orifices.

A spaced series of internal piezoelectric sidewall portions of the printhead body separate and laterally bound the channels along their lengths. To eject an ink droplet through a selected one of the discharge orifices, the two printhead sidewall portions that laterally bound the channel associated with the selected orifice are piezoelectrically deflected into the channel and then returned to their normal undeflected positions. The driven inward deflection of the opposite channel wall portions increases the pressure of the ink within the channel sufficiently to initiate the ejection of a small quantity of ink, in droplet form, outwardly through the discharge orifice.

The electrical signals required to create and control the requisite printhead channel sidewall deflections are typically generated by a suitable electronic driver. Due to the large number of very closely spaced ink channels present in even a small ink jet printhead structure, the resulting number of these electrical signals is quite high, while the physical area available at each ink channel for making the necessary printhead/driver connection is quite small. Accordingly, the connection of the printhead to its associated electronic driver has typically presented a significant connectivity design challenge.

One approach to this connectivity problem has been to mount the electronic driver directly on the printhead body with accompanying circuitry to eliminate the need for a large number of interconnects from the printhead structure to the overall ink jet printing system. Most commonly, this was accomplished by providing an elongated lower body portion of which the top side surface of the rear portion thereof provided a surface, commonly referred to as the "back porch", for mounting the aforementioned electronic driver and accompanying circuitry and an area for interconnecting the remainder of the printer electronics with the electronic driver. However, as detailed below, this approach undesirably results in a very substantial increase in the overall cost of the printhead structure.

Another approach to this connectivity problem has been to mount the electronic driver remotely from the printhead and provide the requisite electrical connections from the printhead channel sidewalls to the remotely disposed driver. One method previously proposed for providing this printhead-to-driver interconnect structure has been to form a high density, parallel array of electrically conductive surface traces on the back porch of the printhead body and use a specially designed flexible ribbon connector to form the connection between these high density traces and a much lower density parallel array on a printed circuit board associated with the driver.

In accordance with this method, the flexible connector has formed thereon a high density series of electrically conductive surface traces registrable with the traces on the back porch of the printhead body, a low density series of electrically conductive surface traces registrable with corresponding traces on the driver circuit board, and a trace "fan-out" section interconnecting the high and low density connector traces. In actually forming the printhead-to-driver interconnection, the high and low density trace sections on the flexible connector are respectively soldered (using a pressure/heat reflow process) to the high density trace section on the printhead body and to the low density trace section on the driver circuit board.

Despite this rather straightforward approach to electrically interconnecting the printhead to an associated electronic driver, the use of a flexible ribbon connector in this manner also greatly increases the cost associated with the overall printhead/driver system. Because of the significant pitch transition required in the flexible connector (a representative transition being from about a 3 mil pitch to about a 50 mil pitch), the cost of the specially designed flexible connector can substantially exceed the cost of the printhead structure with which it is used.

Additionally, in all of the aforementioned techniques, the use of the rear portion of the ink jet printhead, whether for mounting a drive system or interconnecting a flexible connector, makes interconnection of the printhead with an ink supply, most commonly using an ink manifold formed in the rear portion of the printhead, increasingly difficult. Passivization processes, in which the interior side surfaces of the channels are coated with an inactive material are equally complicated by the use of the rear portion of the ink jet printhead for mounting or interconnecting a drive system in that the drive system and any interconnections thereto must be kept clean from the material used to passivate the channels. Finally, the requirement of a projecting lower body portion to form the back porch for mounting or interconnection purposes wastes a significant amount of material, thereby adding to the cost of manufacturing such a printhead.

In view of the foregoing it can readily be seen that it would be desirable to provide a ink jet printhead interconnectable with an associated drive system from one side thereof and a method of manufacturing such a printhead. It is accordingly an object of the present invention to provide such a printhead and a method of manufacturing the same.

SUMMARY OF THE INVENTION

In one embodiment, the present invention is of a method of manufacturing a base portion of an ink jet printhead having a plurality of generally parallel, longitudinally extending ink-carrying channels for the ejection of droplets of ink therefrom and interconnectable with an associated drive system from a single side thereof. A block of insulative material is provided and a plurality of apertures which extend from top to bottom side surfaces of the block are formed therein. Conductive material is then deposited on the interior and top side surfaces of the insulative block. The conductive material on the top side surface is arranged into a plurality of sections, each electrically isolated from the remaining sections and electrically connected with the conductive material deposited on the interior side surface which defines one of the apertures. A pin electrically connected with one of the sections of conductive material deposited on the top side surface is insertably mounted in each of the apertures formed in the block of insulative material.

In another embodiment, the present invention is of a method for manufacturing a channel array for an ink jet printhead interconnectable from one side thereof. An insulative lower body portion having a plurality of generally parallel, longitudinally extending strips of conductive material formed along a top side surface, a corresponding plurality of conductive pins projecting from a bottom side surface and means for electrically connecting each of the pins with a corresponding one of the strips is provided. A bottom side surface of a first active intermediate body portion poled in a first direction generally parallel to the lower body portion is conductively mounted to the top side surface of the lower body portion and a bottom side surface of a second active intermediate body portion poled in a second, opposite, direction is conductively mounted to a top side surface of the first active intermediate body portion. A plurality of generally parallel, longitudinally extending grooves which extend through the second intermediate body portion to expose generally parallel, longitudinally extending portions of the top side surface of the lower body portion located between the strips of conductive material are then formed at spaced locations along a top side surface of the second intermediate body portion. A bottom side surface of an insulative upper body portion is then conductively mounted to the top side surface of the second intermediate body portion.

In yet another embodiment, the present invention is of a single side interconnectable ink jet printhead which includes a lower body portion having a plurality of conductive sections mounted to a top side of the lower body portion and a corresponding plurality of conductive pins projecting from a bottom side of the lower body portion. Each of the conductive sections is electrically connected to the corresponding one of the conductive pins. A bottom side surface of each one of a plurality of generally parallel, longitudinally extending first intermediate body portions, each formed of an active piezoelectric material poled in a first direction parallel to the top side surface of the lower body portion is conductively mounted to a portion of the top side surface of the lower body portion. A bottom side surface of each one of a plurality of generally parallel, longitudinally extending second intermediate body portions, each formed of an active piezoelectric material poled in a second direction opposite to the first direction is conductively mounted to a top side surface of a corresponding one of the first intermediate body portions and a bottom side surface of an insulative upper body portion is conductively mounted to a top side surface of each of the plurality of second intermediate body portions.

DETAILED DESCRIPTION

Figure 1B:
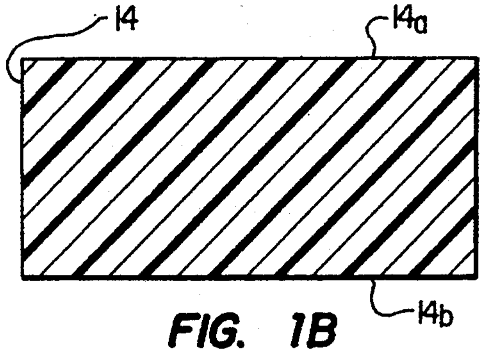
FIG. 1B is a first cross-sectional view taken along lines 1B-E—1B-E of FIG. 1A which illustrates a block of insulative material suitable for manufacture into the lower body portion of FIG. 1A.
Figure 1C:
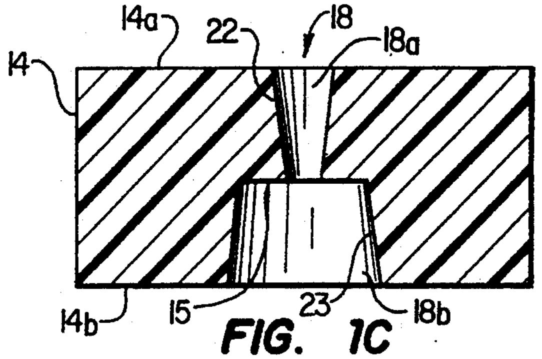
FIG. 1C is a second cross-sectional view taken along lines 1B-E—1B-E of FIG. 1A of the block of insulative material illustrated in FIG. 1B after forming an aperture which extends between top and bottom side surfaces thereof.
Figure 1D:
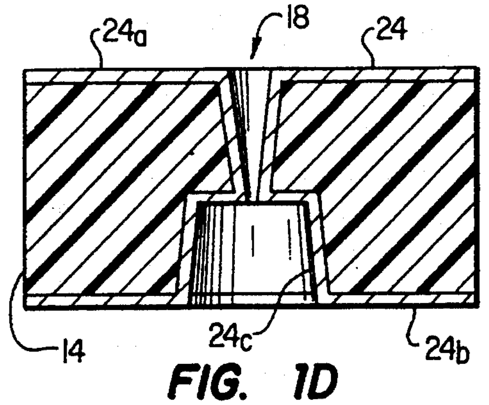
FIG. 1D is a third cross-sectional view taken along lines 1B-E—1B-E of FIG. 1A of the apertured block of insulative material illustrated in FIG. 1C after deposit of a conductive material on the surfaces thereof.
Figure 1E:
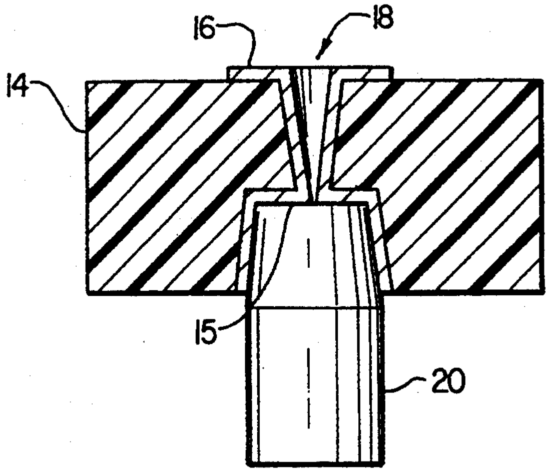
FIG. 1E is a fourth cross-sectional view taken along lines 1B-E—1B-E of FIG. 1A of the metallized apertured block of insulative material illustrated in FIG. 1D after removal of a portion of the deposited conductive material and mounting of a conductive pin thereto.
Figure 1A:
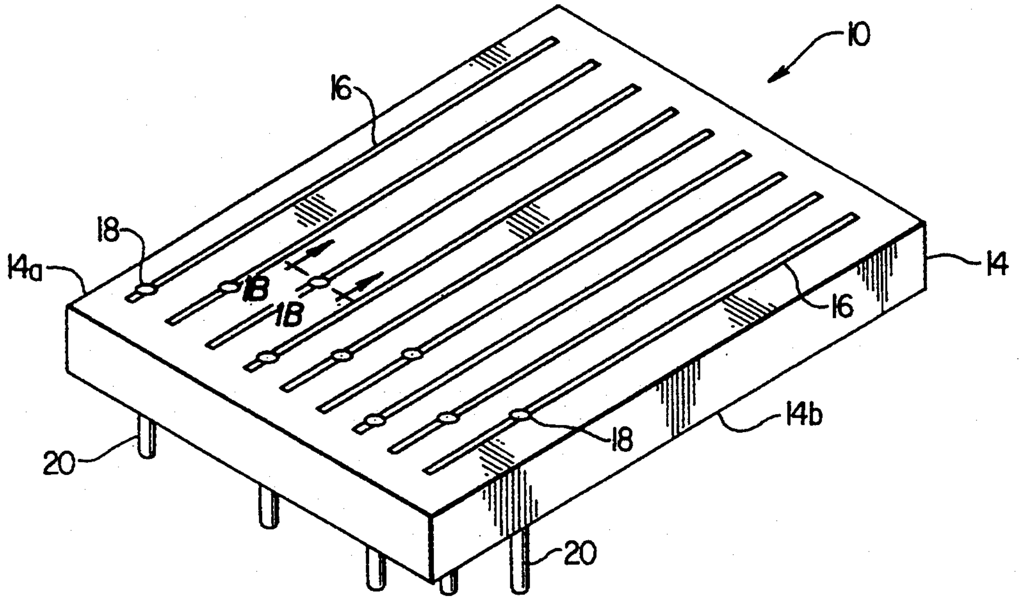
FIG. 1A is a perspective view of a lower body portion of an ink jet printhead interconnectable with a drive system from one side thereof and constructed in accordance with the teachings of the present invention.
Figure 2:
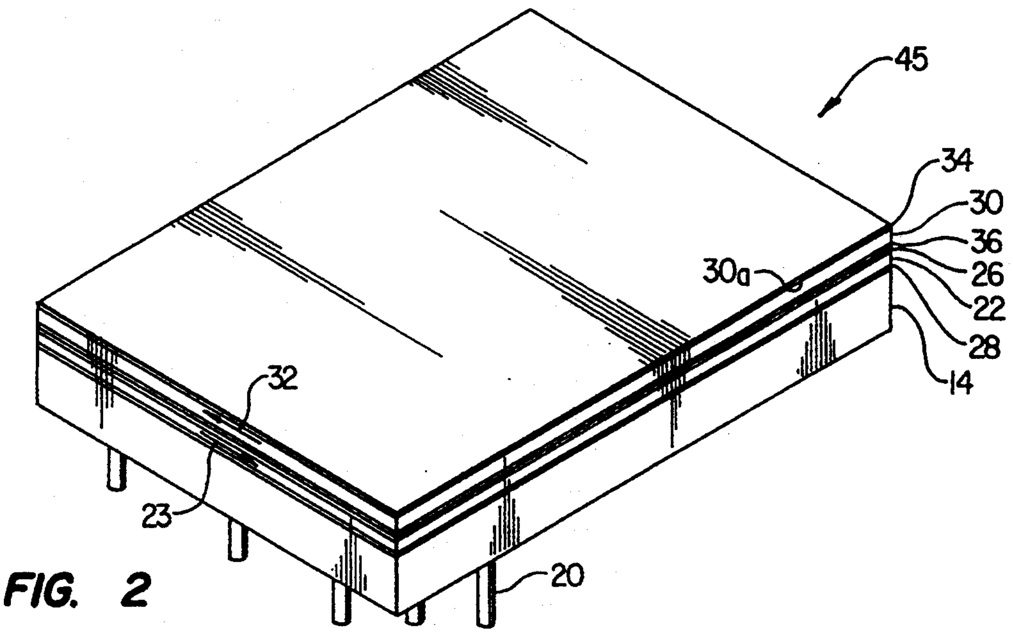
FIG. 2 is a perspective view of the lower body portion of FIG. 1A after first and second intermediate body portions have been conductively mounted thereto.

Referring first to FIG. 1A, a lower body portion 10 of an ink jet printhead 12 interconnectable with an associated drive system from a single side thereof may now be seen. The lower body portion 10 includes a base portion 14 formed from a block of patternable insulative material, for example, a block of fotoceram material. Formed on a top side surface 14a of the base portion 14 are a series of generally parallel, longitudinally extending strips 16, each formed of a conductive material such as metal. As will be more fully described below, each strip 16 provides an electrical connection between an external drive system and a sidewall actuator for the ink jet printhead 12. Formed along each strip 16 is a metal plated aperture or via 18 which extends from the top side surface 14*a*, where it is electrically connected with the corresponding strip 16, to a bottom side surface 14*b* of the lower body portion 10 where it is electrically connected with a corresponding conductive pin 20. Preferably, the vias 18 are formed in a staggered pattern which produces a contact pitch easy to interconnect therewith. Furthermore, it is contemplated that all of the vias 18 may be formed in the front end of the printhead 12 so that the rear end may be used to form a manifold and internal conduit for supplying ink to the printhead 12.

Pins 20 are used to interconnect one side of the ink jet printhead 12 with a drive system (not visible in FIG. 1A) for applying voltages to selected piezoelectric sidewall actuators of the ink jet printhead 12 to cause the deflection of the selected sidewall actuators into an ink-carrying channel partially defined by the selected sidewall actuators, thereby imparting a compressive pressure pulse capable of initiating the ejection of a droplet of ink therefrom.

Referring next to FIGS. 1B-1E, first, second, third and fourth cross-sections taken across line 1B-1E—1B-1E of FIG. 1A illustrate a method of manufacturing the lower body portion 10 which will now be described in greater detail. As may be seen in FIG. 1B, manufacture of the lower body portion 10 is commenced by providing a lower body portion 14 formed from a block of patternable insulative material such as fotoceram. Turning next to FIG. 1C, a series of apertures 18 are then formed in the insulative base portion 14, for example, by a conventional lithographic and etch process well known in the art. Preferably, the apertures 18 are formed by a two step process in which first, inwardly tapered, aperture portions 18*a*, each of which extend a first distance into the base portion 14, are formed at a first series of spaced locations along the top side surface 14*a* of the base portion 14 and second, inwardly tapered aperture portions 18*b*, each having a diameter greater than the first aperture portions 18*a*, are then formed at a second series of spaced locations along the bottom side surface 14*b* of the base portion 14. Each second aperture portion 18*b* extends a distance into the base portion 14 such that an interior surface 15 is exposed and the corresponding first and second aperture portions 18*a* and 18*b* are in communication with each other. For ease of illustration, FIG. 1A illustrates nine apertures 18 formed in the base portion 14. It is contemplated, however, that an aperture 18 will be formed for every sidewall actuator of the ink jet printhead 12 to be manufactured in accordance with the techniques disclosed herein. Typically, an ink jet printhead similar to those disclosed herein will include on the order of about 150-400 channels per inch of length.

Turning next to FIG. 1D, the base portion 14 is then metallized, for example, using a conventional deposition process, so that the entire top and bottom side surfaces 14*a*, 14*b* and the exposed interior surfaces 15, 22, 23 which define the first and second aperture portions 18*a*, 18*b* are covered with a thin layer 24 of a conductive material, for example, metal. As illustrated in FIG. 1D, the conductive layer 24 includes a first portion 24*a* which covers the top side surface 14*a*, a second portion 24*b* which covers the bottom side surface 14*b* and a third portion 24*c* which covers the exposed interior surfaces 15, 22 and 23.

Turning next to FIG. 1E, the entire layer 24*b* of conductive material deposited on the bottom side surface 14*b* and part of the layer 24*a* of conductive material deposited on the top side surface 14*a* are then stripped away, for example, using a patterning process. As illustrated in FIG. 1A, only a series of longitudinal strips 16 of conductive material remain on the top side surface 14*a* of the base portion 14 after removal of a significant part of the layer 24*a*. Preferably, the strips 16 are formed to have a width slightly less than the width of sidewall actuators 39 to be formed on top of and conductively mounted to the strips 16 in a manner more fully described below. A conductive pin 20 is then insertably mounted in each of the second aperture portions 18*b* of the apertures 18, for example, using a soldering process, such that each pin 20 engages the inner surface 15 of one of the apertures 18, thereby electrically connecting the pin 20 to a corresponding strip 16 of conductive material by the portion 24*c* of the conductive layer 24 deposited on the inner surfaces 15, 22 and 23 which define the aperture 18.

Rather than being stripped away in the patterning process detailed above, in an alternate embodiment of the invention, it is contemplated that the portion 24*a* of the layer 24 of conductive material deposited on the top side surface 14*a* of the lower body portion may initially be left intact. In this embodiment, however, isolation of the electrical connection of each pin 20 to only a portion of the conductive material deposited on the top side surface 14*a* would be achieved during assembly of the channel array for the ink jet printhead where, when constructing the channels of the array, the process by which the channels are formed would be modified such that each groove formed during this process would extend into the base portion 14 so that portions of the conductive layer 24*a* would be removed to expose parts of the insulative base portion 14, each of which would function as a bottom wall for one of the ink-carrying channels of the array. By forming the channels in this manner, this layer 24*a* of conductive material would, in effect, be patterned to form the series of conductive strips 16, each electrically connected to a single pin 20. However, such a technique would advantageously avoid problems which may arise when attempting to align a saw or other device used to form the grooves in the channel array such that each groove formed during the process is positioned between a pair of the strips 16.

Referring next to FIGS. 1A and 2-4, a method of manufacturing a channel array 45 for an ink jet printhead configured for interconnection with an associated drive system from one side thereof and constructed in accordance with the teachings of the present invention will now be described in greater detail. Starting with the lower body portion 10, a first intermediate body portion 22 constructed of an active piezoelectric material, for example, lead zirconate titante (or "PZT"), poled in a first direction 23 generally parallel to the lower body portion 10, and having first and second layers 26, 28 of a conductive material, for example, metal, mounted to top and bottom side surfaces 22*a* and 22*b*, respectively, is aligned, mated and conductively bonded, for example, using a conductive adhesive (not shown), for example, conductive epoxy, such that the conductive layer 28 is conductively mounted to the conductive strips 16. Next, a second intermediate body portion 30 constructed of an active piezoelectric material, for example, PZT, poled in a second direction 32, opposite to the first direction 23 but also parallel to the lower body portion 10, and having first and second layers 34, 36 of a conductive material, for example, metal, mounted to top and bottom side surfaces 30*a* and 30*b*, respectively, is aligned, mated and conductively bonded, again using a conductive adhesive (not shown) such as conductive epoxy, to the top side surface 22*a* of the first intermediate body portion 22.

Figure 3:
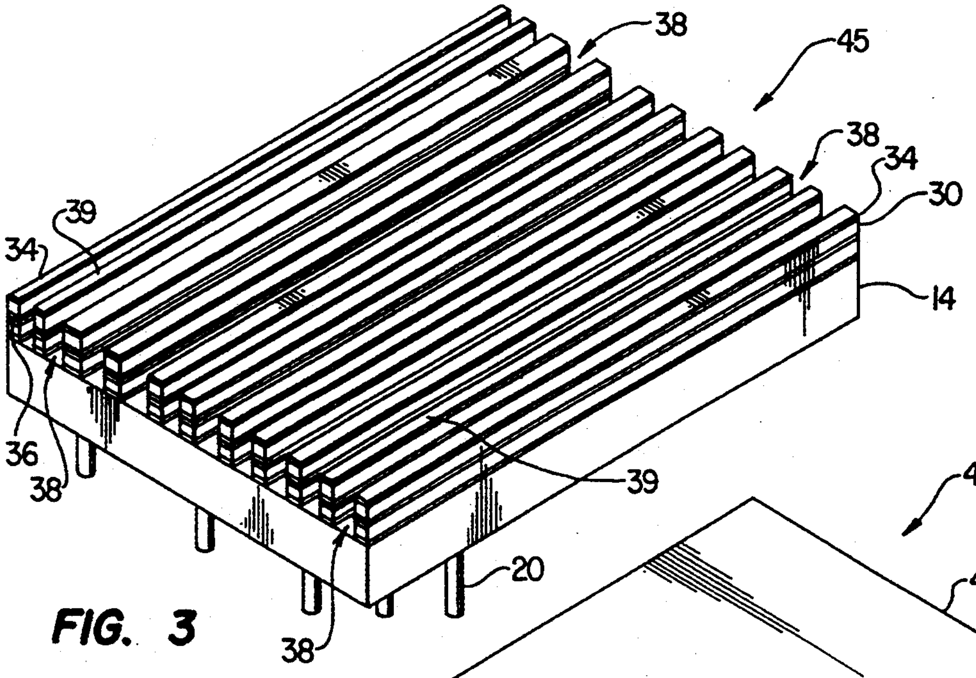
FIG. 3 is a perspective view of the lower and first and second intermediate body portions of FIG. 2 after a series of generally parallel, longitudinally extending grooves have been formed therein.

Referring next to FIG. 3, a series of longitudinally extending, generally parallel grooves 38 are formed in the channel array 45, most commonly, using a conventional diamond sawing process. Preferably, each groove 38 should be formed such that it extends through the conductive layer 34, the second intermediate body portion 30, the conductive layer 36, the conductive layer 26, the first intermediate body portion 22, the conductive layer 28 and partially through the insulative lower body portion 10 of the channel array 45. During the forming process, the grooves 38 are precisely located such that they are formed in between the longitudinally extending, generally parallel strips 16 of conductive material. It should be noted, however, that so long as a portion of a given conductive strip 16 is in electrical connection with the conductive layer 28, the inadvertent removal of part of that conductive strip 16 due to a misalignment in positioning the saw during the forming process would not impact the operation of the ink jet printhead 12 in any manner.

By forming the grooves 38 in this manner, a series of generally parallel, longitudinally extending piezoelectric sidewall actuators 39 are formed, preferably in a manner such that one of conductive strips 16 runs lengthwise along the longitudinal extension of one of the sidewall actuators 39 and is of a slightly lesser width than the actuator 39. It is noted that, if the grooves 38 are precisely located between the conductive strips 16, the grooves need only to extend through the conductive layer 28 and need not extend into part of the lower body portion 14 to ensure electrical isolation of each strip 16. In any event, it is strongly recommended that the grooves 38 are formed such that they extend into the lower body portion 14 for both ease of manufacture and to ensure electrical isolation of the strips in the event of a minor misalignment during the sawing process. Additionally, in the embodiment of the invention where the conductive layer 24*a* is not patterned into the plurality of longitudinally extending, generally parallel strips 16, the grooves 38 must extend through the conductive layer 24*a* and into the lower body portion 14 to form electrically isolated strips 16 of conductive material, each electrically connected to a single sidewall actuator 39.

Figure 4:
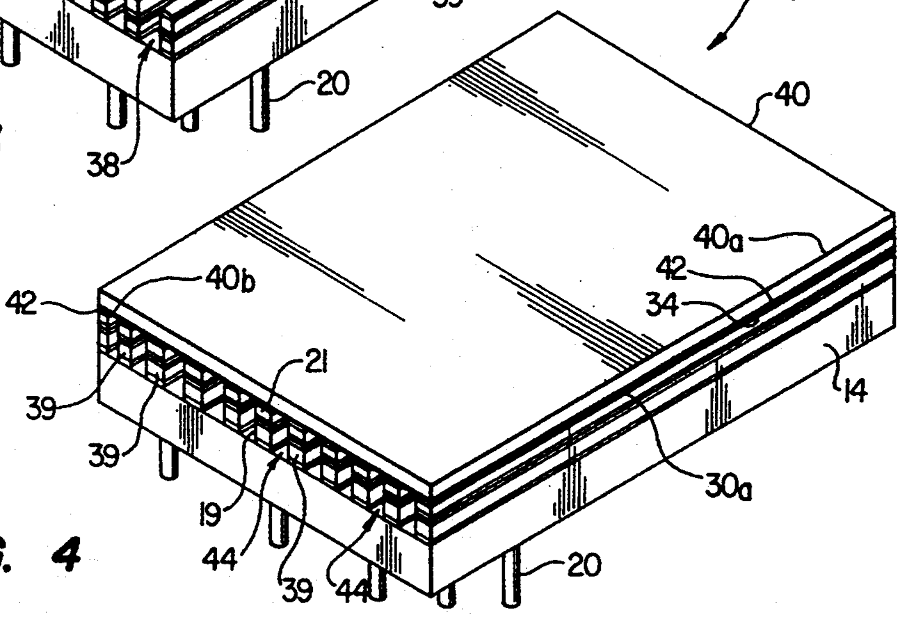
FIG. 4 is a perspective view of the grooved lower and first and second intermediate body portions of FIG. 3 after an upper body portion has been conductively mounted thereto to form a channel array for a single sided drive system interconnectable ink jet printhead which is interconnectable from a bottom side surface thereof.

Referring next to FIG. 4, an upper body portion 40 constructed of an insulative material and having top and bottom side surfaces 40*a* and 40*b* is aligned, mated and conductively bonded, for example, using a conductive adhesive (not shown) such as conductive epoxy, to the top side surface 30*a* of the second intermediate body portion 30 such that a layer 42 of conductive material, for example, metal, formed on the bottom side surface 40*b* of the upper body portion 40 is conductively mounted to the layer 34 of conductive material formed on the top side surface 30*a* of the second intermediate body portion 30. In this manner, a plurality of longitudinally extending, generally parallel ink-carrying channels 44, each defined by part of the lower body portion 14, a first sidewall actuator 39 comprised of a section 19 of the first intermediate body portion 22 and a section 21 of a second intermediate body portion 30, part of the upper body portion 40 and a second sidewall actuator 39, similarly comprised of a section 19 of the first intermediate body portion 22 and a section 21 of the second intermediate body portion 22, are formed. The assembly of a channel array 45 for an ink jet printhead 12 interconnectable to an associated drive system from one side thereof is now complete.

Figure 5:
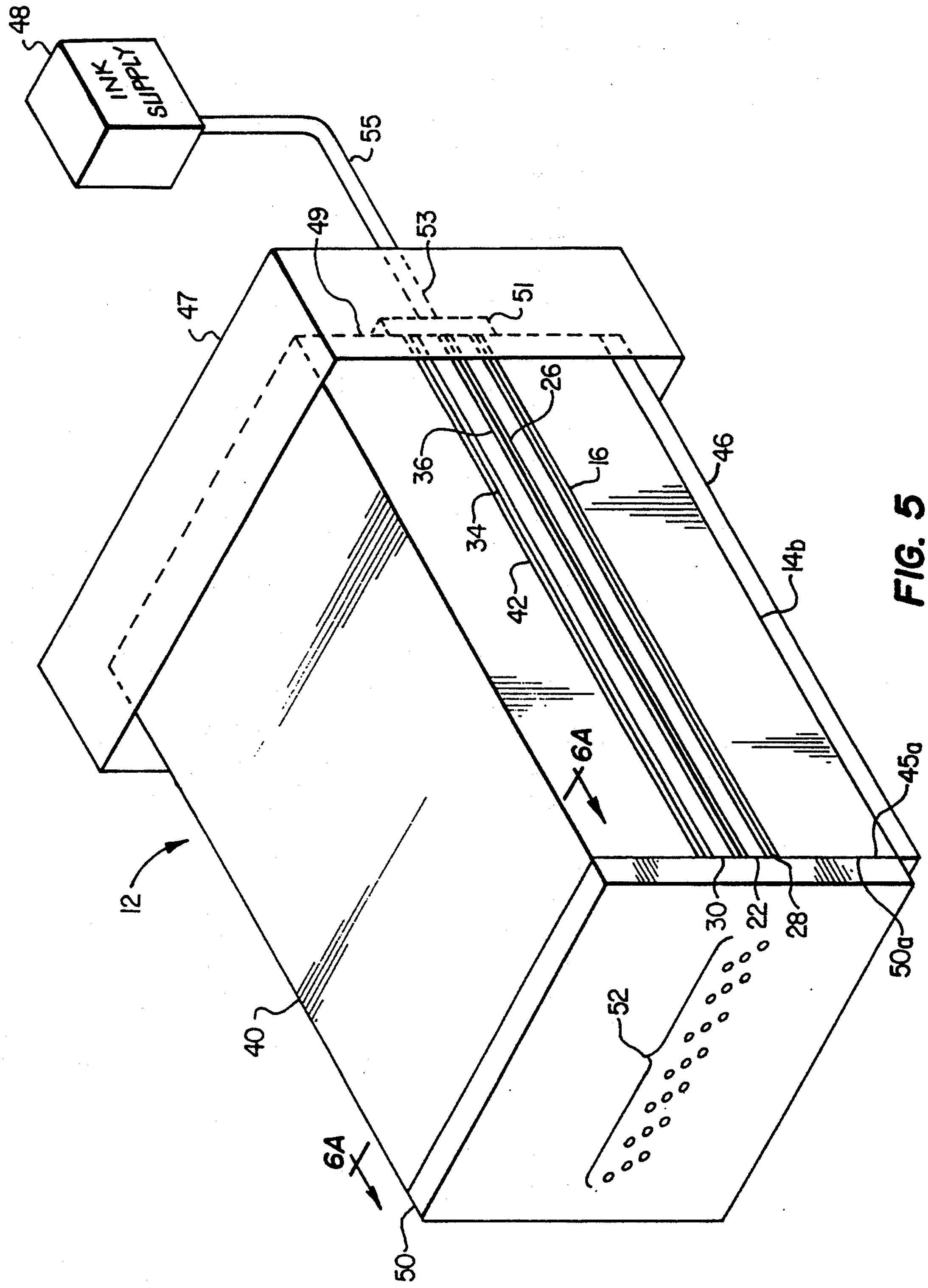
FIG. 5 is a perspective view of a fully assembled ink jet printhead having a drive system interconnectable from a bottom side surface thereof.

Referring next to FIG. 5, a fully assembled ink jet printhead 12 which incorporates the channel array 45 may now be seen. To supply ink to the ink-carrying channels 44 of the channel array 45, an external manifold 47 is mounted onto the ink jet printhead such that a rear portion (shown in phantom) of the ink jet printhead 12 is received in an interior portion 49 thereof. The manifold 47 has a laterally extending interior channel 51 formed along the interior portion 49 thereof such that the interior channel 51 is in communication with the open rear ends of the ink-carrying channels 44. An internal conduit 53 having one end in communication with the internal channel 51 is formed in the external manifold 47. The internal conduit 53 is then connected to an external ink conduit 55 to provide means for supplying ink to the ink-carrying channels 44 from a source of ink 48 connected to the external conduit 55. A back side surface 50*a* of an orifice plate 50 is then mounted to a front side surface 45*a* of the channel array 45 such that each orifice 52 extending through the orifice plate 50 is in communication with a corresponding one of the ink-carrying channels 44 such that, when a channel 44 is compressed by application of a voltage to a sidewall actuator 39 partially defining the channel 44, a droplet of ink will be ejected out of the orifice 52 in communication with the compressed channel 44 shortly thereafter and additional ink from the ink supply 48 will be drawn into the channel 44 from which the ink droplet had been ejected therefrom via the external conduit 46, the internal conduit 53 and the interior channel 51.

As should be clearly appreciated by those skilled in the art, in comparison to prior ink jet printheads, the electrical connection of the ink jet printhead 12 has been tremendously simplified. To electrically connect the ink jet printhead 12, the layer of conductive material 42 should be electrically connected to ground, as schematically illustrated in FIG. 5, and each pin 20, which, as more fully described below, controls the actuation of a sidewall actuator 39, is electrically connected to a driver capable of selectively applying a positive or negative voltage to the pin 20. For example, a driver board 46 having a plurality of pin-receiving apertures (not shown) for receiving the pins 20 may be snap-mounted onto the bottom side surface 14*b* of the channel array 45. Preferably, the driver board 46 should include a controller for issuing control signals to actuate selected ones of the sidewall actuators 39 and a series of switching structures capable of generating a positive or negative voltage at an output thereof in response to instructions issued by the controller. When the driver board 46 is snap-mounted onto the channel array 45, each output of a switching structure should become electrically connected with one of the pins 20. Thus, a snap-in driver board 46 may be used to provide a separate electrical connection to every sidewall actuator 39 for the ink jet printhead 12.

As should be further appreciated by those skilled in the art, in comparison to prior ink jet printheads, considerable flexibility has been added to the interconnection of the ink jet printhead 12 and the ink supply 48. In prior ink jet printheads, electrical interconnection between the ink jet printhead and its controller was made at the rear of the printhead. For this reason, it was previously recommended that the manifold and internal ink conduit necessary for ink to be supplied to all of the ink-carrying channels. By providing an ink jet printhead 12 interconnectable from one side, either top or bottom, thereof, the rear portion of the ink jet printhead is now available for other uses such as the rear mounted manifold 47 described herein.

Figure 6A:
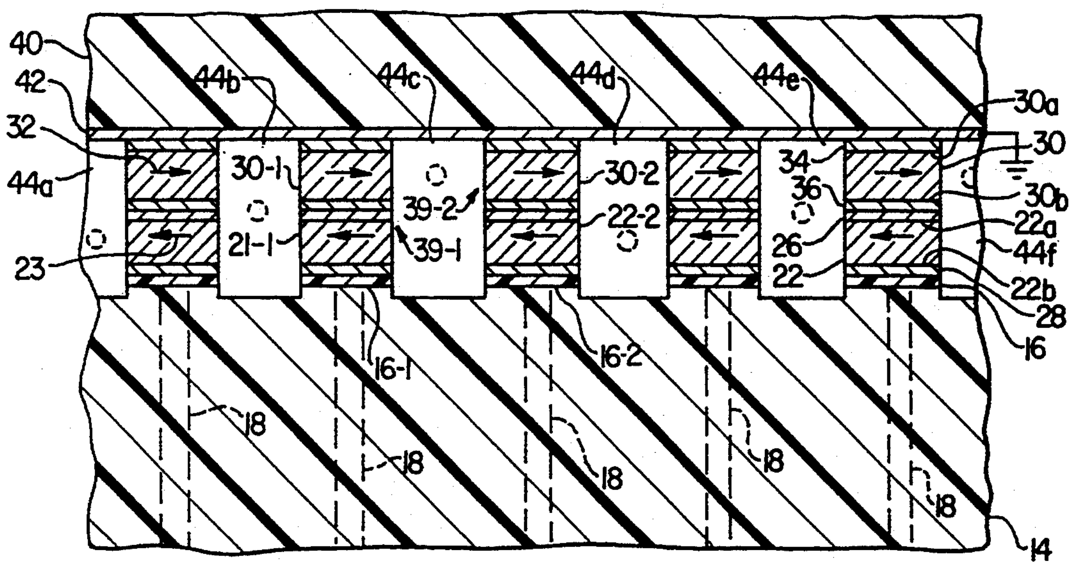
FIG. 6A is an enlarged partial cross-sectional view taken along lines 5—5 of FIG. 5 and illustrating the channel array for the single sided drive system interconnectable ink jet printhead of FIG. 5.

Referring next to FIG. 6A, ink-carrying channels **44*a*–44*a* and the portions of the channel array 45 which define the channels 44*a–f* may now be seen in greater detail. For example, the ink-carrying channel 44*c* is defined by a first, longitudinally extending sidewall actuator 39-1 formed by first intermediate portion 22-1 and second intermediate portion 30-1, part of the upper body portion 40, a second sidewall actuator 39-2 formed by first intermediate portion 22-2 and second intermediate portion 30-2 and part of the lower body portion 14. It should be noted that, while the conductive strips 16 have a slightly lesser width than the sidewall actuators 39**, for ease of illustration, FIGS. 6A–C illustrate the two as having equal widths.

Figure 6D:
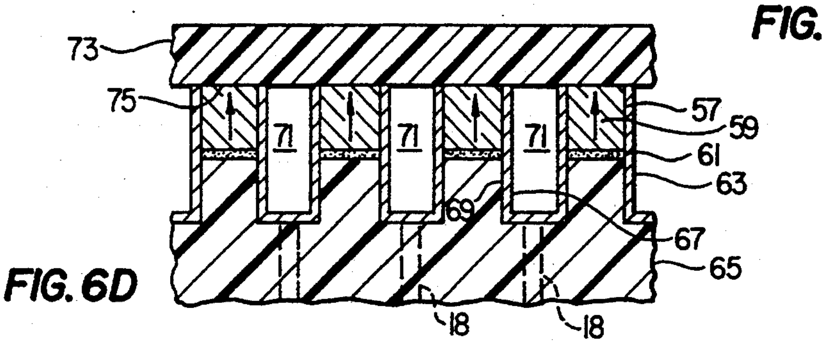
FIG. 6D is another alternate embodiment of the ink jet printhead with bottom side surface interconnectable drive system illustrated in FIGS. 5–6C.
Figure 6C:
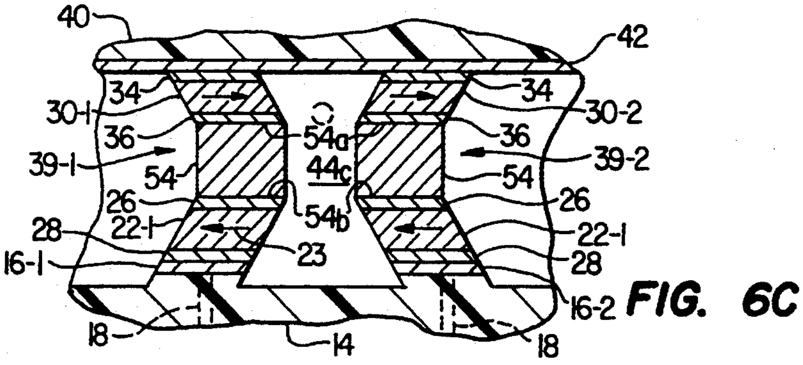
FIG. 6C is an enlarged view of an alternate embodiment of the configuration of the sidewall illustrated in FIG. 6B when actuated by the associated drive system.
Figure 6B:
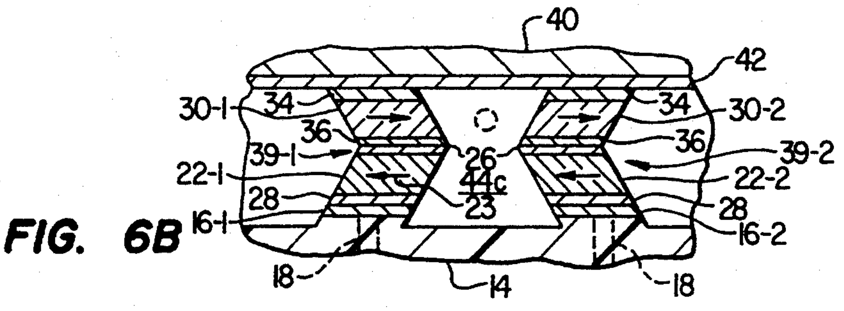
FIG. 6B is an enlarged view of FIG. 6A which illustrates displacement of a sidewall of the channel array when actuated by an associated drive system.

Referring next to FIG. 6B, the ejection of a droplet of ink from the channel **44*c* which is caused by deflecting the first sidewall actuator 39-1 and the second sidewall actuator 39-2 into the channel 44*c* will now be described in greater detail. To deflect the first sidewall actuator 39-1 into the channel 44*c*, a positive voltage is applied to the conductive strip 16-1 by the associated drive system using the via 18 electrically connected therewith, thereby creating a voltage drop across the intermediate body portions 22-1, 30-1 and ground (conductive layer 42). Because the first intermediate body portion 22-1 is poled in a first direction 23 generally orthogonal to the voltage drop and the second intermediate body portion 30-1 is poled in a second direction 32, opposite to the first direction 23, but also orthogonal to the voltage drop, both the first and second intermediate portions 22-1 and 30-1** will, as illustrated in FIG. 6B, deflect into the channel in shear mode.

Simultaneous with the application of a positive voltage to the conductive strip 16-1, a negative voltage of equal magnitude is applied to the conductive strip 16-2, again using the via 18 connected therewith, to create a voltage drop between ground (conductive layer 42) and the conductive strip 16-2 which is orthogonal to the first and second poling directions 23, 32 of the first and second intermediate body portions 22-2 and 30-2. By reversing the direction of the voltage drop while maintaining the same poling directions 23, 32, the first and second intermediate body portions 22-2 and 30-2 will now deflect in the opposite direction which, as illustrated in FIG. 6B, is again into the channel **44*c*. Of course, the first and second intermediate portions 22-1 and 30-1 may be deflected into the channel 44*b* and the first and second intermediate portions 22-2 and 30-2 may be deflected into the channel 44*d* by applying negative and positive voltages, respectively, at the conductive strips 16-1 and 16-2. For example, suitable positive and negative voltages to cause the deflection of a sidewall actuator 39 into an ink-carrying channel 44** are +40 and −40 volts.

Referring next to FIG. 6C, an alternate configuration of the sidewall actuators 39-1 and 39-2 which increases the extent of deflection into the channel **44*c* by the sidewall actuators 39-1 and 39-2, respectively, may now be seen. In this configuration, a top side 54*a* of conductive spacers 54 is conductively mounted to conductive layer 36 and a bottom side 54*b* of the conductive spacers 54 is conductively mounted to the conductive layer 26**.

Referring next to FIG. 6D, an alternate embodiment of a bottom side surface interconnectable ink jet printhead will now be described in greater detail. Here, a series of intermediate sidewall portions 57, each formed of an active piezoelectric material poled in the direction of arrow 59, are mounted by adhesive layer 61 to projections 63 of inactive lower body portion 65. A layer 67 of conductive material is then applied to inner surfaces 69 which define the side and bottom walls of channels 71. Assembly of the channel array is then completed by mounting upper body portion 73 to upper side surfaces 75 of the active intermediate sidewall portions 57. Shear mode deflection of the intermediate sidewall portions 57 into the channels 71 require the application of voltage to selected ones of the conductive layers 67. Vias 18, which are again formed in the lower body portion 65 in the manner previously described are used to apply voltage to the selected conductive layers 67. In this embodiment, however, the vias 18 provide an electrical connection to the channels 71 rather than the sidewalls as set forth in the previously described embodiments of the invention illustrated in FIGS. 6A–C.

Figure 6E:
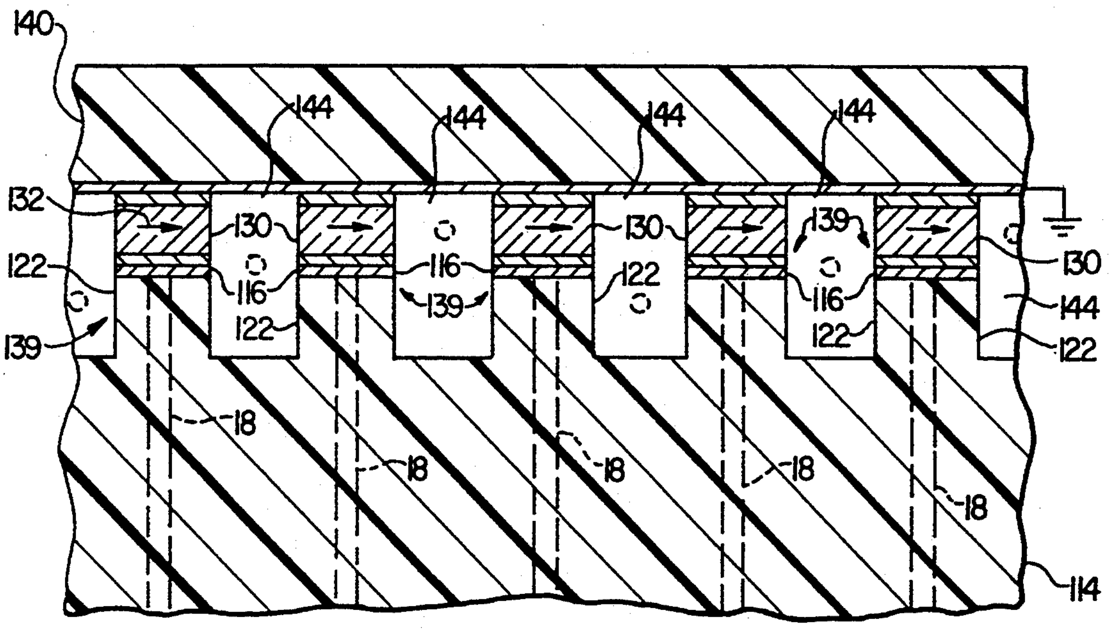
FIG. 6E is yet another alternate embodiment of the ink jet printhead with bottom side surface interconnectable drive system illustrated in FIGS. 5–6C.

Referring next to FIG. 6E, yet another alternate embodiment of a bottom side surface interconnectable ink jet printhead will now be described in greater detail. Here, a series of ink-carrying channels 144 are defined by a lower body portion 114 having a series of longitudinally extending, generally parallel projections 122, longitudinally extending, generally parallel intermediate portions 130, and part of the upper body portion 140. The .intermediate portions 130 are formed of an active material poled in direction 132. This embodiment differs from that illustrated in FIGS. 6A–B only in that the first intermediate portions 22 illustrated in FIG. 6A have been removed and the channels 144 now extend into the lower body portion 114. Accordingly, in this embodiment, the sidewalls 139 are comprised of the inactive projections 122 of the lower body portion 114 and the active intermediate body portions 130 which, upon application of a voltage thereto, will deflect into the channels 144 in a shear motion. In this embodiment, therefore, the vias 18 should be extended to the conductive layers 116 so that sidewall deflecting voltages may be applied directly to the intermediate body portions 130.

Figure 7:
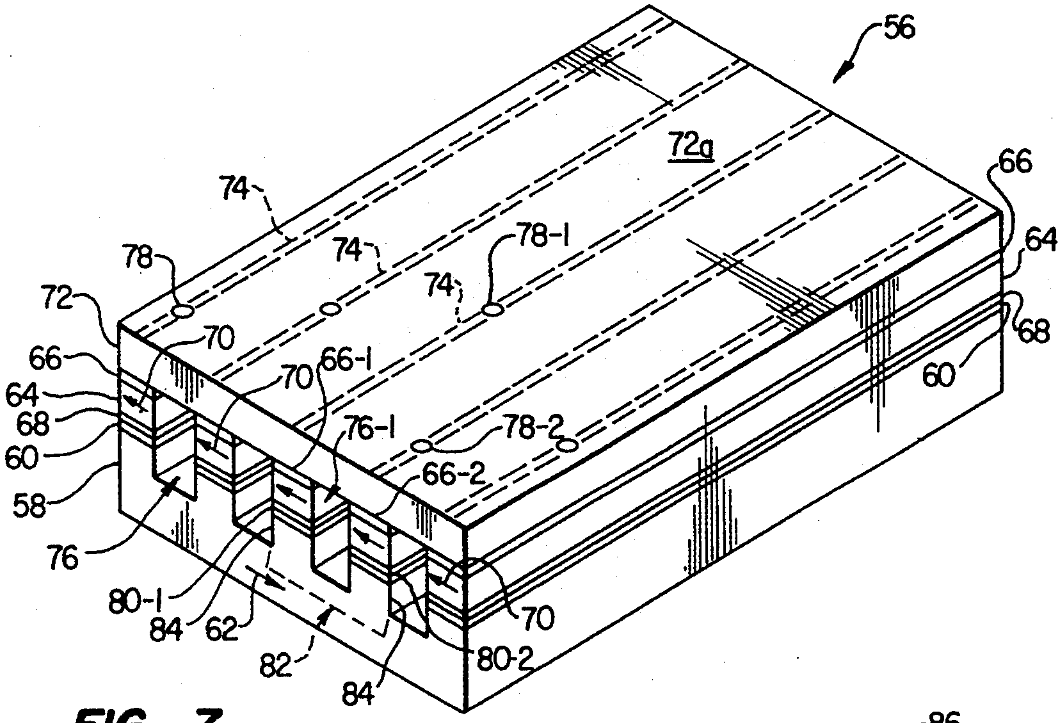
FIG. 7 is an alternate embodiment of the channel array for a single sided drive system interconnectable ink jet printhead of FIG. 4 which is interconnectable from a top side surface thereof.

Referring next to FIG. 7, an alternate embodiment of a channel array 56 suitable for interconnection with an associated drive system from one side thereof, which, in this embodiment of the invention, is the top side, may now be seen. In this embodiment, a lower body portion 58 constructed of an active piezoelectric material poled in a first direction 62 and having a layer 60 of conductive material formed on a top side surface thereof is first provided. A bottom side surface of an intermediate body portion 64 having first and second layers 66, 68 of conductive material respectively formed on the top and bottom side surfaces thereof, is then conductively mounted to the top side surface of the lower body portion 58. The intermediate body portion 64 is formed of an active piezoelectric material poled in a second direction 70 oppositely orientated to, but parallel with the first direction 62.

After mounting the lower and intermediate body portions 58, 64 together, a series of generally parallel, longitudinally extending grooves which extend through the entire intermediate body portion 64 and part of the lower body portion 58 are formed, for example, by a sawing process. A bottom side surface of an upper body portion 72, similar in design but inverted in orientation to the lower body portion 10 of FIG. 1A is then conductively mounted onto the layer 66 of conductive material. The upper body portion is formed of an insulative material and has a plurality of generally parallel, longitudinally extending conductive strips 74 (shown in phantom in FIG. 7) formed on the bottom side surface thereof. Each conductive strip 74 is electrically connected to the conductive layer 66 and to a via 78 which extends through the upper body portion 72 and to the top side surface 72*a* where interconnection with an associated drive system may be easily achieved.

By forming the channel array 56 in this manner, a plurality of ink-carrying channels 76, each defined by a first intermediate body portion 64, part of the lower body portion 58, a second intermediate body portion 64 and part of the upper body portion 72 are formed. Each ink-carrying channel 76 has first, second and third actuators associated therewith—the first and second intermediate body portions 64 and a generally U-shaped part 82 of the lower body portion 58 which defines a portion of the channel 76. To actuate an ink-carrying channel 76, for example, the channel 76-1, a positive voltage is applied to a first via 78-1 electrically connected to a first sidewall 80-1 which partially defines the channel 76-1 and a negative voltage is applied to a second via 78-2 electrically connected to a second sidewall 80-2 which partially defines the channel 76-1. This creates a voltage drop from the conductive layer 66-1 to the conductive layer 66-2 which causes the intermediate body portion 66-1, the arms 84 of the generally U-shaped part 82 of the lower body portion 14 and the intermediate body portion 66-2 to all deflect into the channel 76-1 to impart an ink ejecting compressive pressure pulse thereto. For example, suitable positive and negative voltages to cause the deflection of the first and second intermediate body portions 64 and the arms 84 of the U-shaped part 82 of the lower body portion 58 into an ink-carrying channel 76 are +80 and −80 volts.

Figure 8:
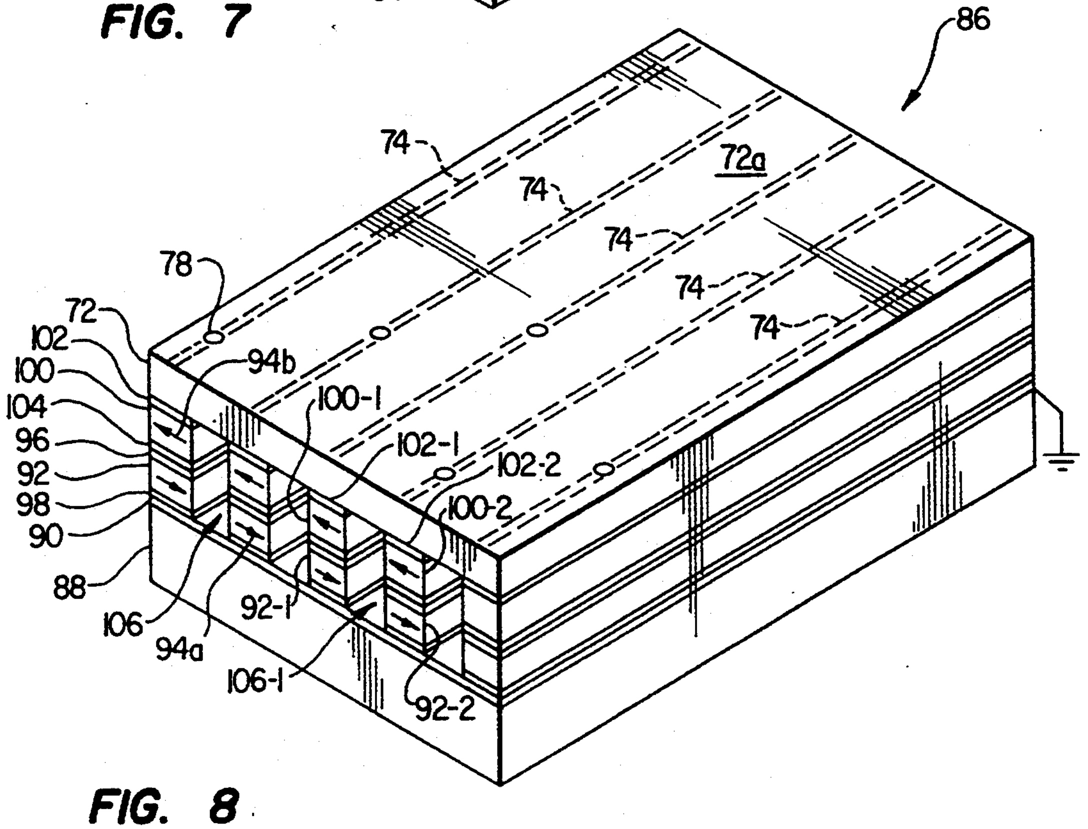
FIG. 8 is a second alternate embodiment of a channel array for a single sided drive system interconnectable ink jet printhead of FIG. 4 which is interconnectable from the top side surface thereof.

Referring next to FIG. 8, a second embodiment of a top side surface drive system interconnectable channel array 86 for an ink jet printhead may now be seen. In this embodiment, an insulative base portion 88 having a layer 90 of conductive material formed on a top side surface thereof and a first intermediate body portion 92 formed from an active piezoelectric material poled in direction 94*a* and having layers 96 and 98 of conductive material respectively formed on top and bottom side surfaces thereof are now provided. The conductive layer 98 of the first intermediate body portion 92 is conductively mounted to the conductive layer 90 of the lower body portion 88. As schematically illustrated in FIG. 8, the conductive layer 90 is also connected to ground.

A second intermediate body portion 100 formed from an active piezoelectric material poled in direction 94*b* and having layers 102 and 104 of conductive material respectively formed on the top and bottom sides thereof is then conductively mounted to the first intermediate body portion 92 by conductively mounting the layers 96 and 104 to each other. A series of generally parallel, longitudinally extending grooves which extend through the second and first intermediate body portions 100 and 92 to expose the conductive layer 90 are then formed, for example, by a sawing process. An upper body portion 72 identical to that illustrated in FIG. 7 is then conductively mounted to the conductive layer 102, thereby forming a plurality of ink-carrying channels 106, each defined by part of the lower body portion 88, a pair of first intermediate body portions 92, a pair of second intermediate body portions 100 and a part of the upper body portion 72.

To actuate an ink-carrying channel, for example, ink-carrying channel 106-1, a positive voltage is applied by an associated drive system to the conductive layer 102-1 and a negative voltage is applied by the drive system to the conductive layer 102-2. By doing so, first and second voltage drops generally orthogonal to the poling direction 94 are formed between the conductive layers 102-1, 102-2, respectively, and ground (the conductive layer 90), thereby causing the deflection of all four active intermediate body portions 92-1, 92-2, 100-1 and 100-2 into the channel 106-1 to impart an ink ejection initiating compressive pressure pulse into the channel 106-1. For example, suitable positive and negative voltages to cause the deflection of the intermediate body portions 92-1, 92-2, 100-1 and 100-2 into the channel 106-1 are +40 and −40 volts.

Thus, there has been described and illustrated herein, an ink jet printhead which is interconnectable with an associated drive system from one side thereof. However, those skilled in the art will recognize that many modifications and variations besides those specifically mentioned may be made in the techniques described herein without departing substantially from the concept of the present invention. Accordingly, it should be clearly understood that the form of the invention as described herein is exemplary only and is not intended as a limitation on the scope of the invention.

What is claimed is:

1. A method of manufacturing a base portion of an ink jet printhead having a plurality of generally parallel, longitudinally extending ink-carrying channels for the ejection of droplets of ink therefrom and interconnectable with an associated drive system from a single side thereof, comprising the steps of:

providing a block of insulative material, said block of material having top and bottom side surfaces;

forming a plurality of apertures extending from said top side surface to said bottom side surface of sad block of insulative material, each of said apertures being defined by an interior side surface and corresponding to one of said plurality of ink-carrying channels;

depositing onductive material on said interior side surfaces and on part of said top side surface of said block of insulative material, said conductive material on said top side surface being arranged into a plurality of sections thereof, each electrically isolated from the remaining sections and electrically connected with said conductive material deposited on said interior side surface defining one of said apertures; and insertably mounting a pin in each of said apertures formed in said block of insulative material;

wherein each said pin is in electrical connection with one of said sections of conductive material deposited on said top side surface.

2. A method of manufacturing a base portion of an ink jet printhead interconnectable from a single side thereof according to claim 1 wherein the step of forming a plurality of apertures extending from said top side surface to said bottom side surface of said block of insulative material further comprises the steps of:

forming a first plurality of inwardly tapered aperture portions which extend from said top side surface to an inner surface of said block of insulative material; and forming a second, corresponding, plurality of inwardly tapered aperture portions which extend from said bottom side surface to said inner surface of said block of insulative material, said second plurality of aperture portions each having greater diameters than and being in communication with a corresponding one of said first plurality of aperture portions.

3. A method of manufacturing a base portion of an ink jet printhead interconnectable from a single side thereof according to claim 2 wherein the step of insertably mounting a pin in each of said apertures further comprises the steps of:

inserting said pin in each of said second aperture portions until said pin engages said inner side surface of said block of insulative material; and securing said pin inserted into each of said second aperture portions.

4. A method of manufacturing a base portion of an ink jet printhead interconnectable from a single side thereof according to claim 1 wherein said conductive material deposited on said top side surface of said block of insulative material is arranged into a plurality of generally parallel, longitudinally extending strips of conductive material, each electrically isolated from the remaining strips and corresponding to one of said plurality of ink-carrying channels.

5. A method of manufacturing a base portion of an ink jet printhead having a plurality of generally parallel, longitudinally extending ink-carrying channels for the ejection of droplets of ink therefrom and interconnectable with an associated drive system from a single side thereof, comprising the steps of:

providing a block of insulative material, said block of material having top and bottom side surfaces;

forming a plurality of apertures extending from said top side surface to said bottom side surface of said block of insulative material, each of said apertures being defined by an interior side surface and corresponding to one of said plurality of ink-carrying channels;

depositing conductive material on said interior side surfaces and said top side surface of said block of insulative material;

removing a portion of said conductive material deposited on said top side surface of said block of insulative material such that the remaining conductive material is arranged as a series of generally parallel, longitudinally extending strips, each said strip electrically isolated from the remaining strips, in electrical communication with said conductive material deposited on said inner side surface defining one of said plurality of apertures and corresponding to one of said ink-carrying channels; and insertably mounting a pin in each of said apertures formed in said block of insulative material;

wherein each said pin is in electrical connection with one of said strips of conductive material longitudinally extending along said top side surface.

6. A method of manufacturing a base portion of an ink jet printhead interconnectable from a single side thereof according to claim 5 wherein the step of forming a plurality of apertures extending from said top side surface to said bottom side surface of said block of insulative material further comprises the steps of:

forming a first plurality of inwardly tapered aperture portions which extend from said top side surface to an inner surface of said block of insulative material; and forming a second, corresponding, plurality of inwardly tapered aperture portions which extend from said bottom side surface to said inner surface of said block of insulative material, said second plurality of aperture portions each having greater diameters than and being in communication with a corresponding one of said first plurality of aperture portions.

7. A method of manufacturing a base portion of an ink jet printhead interconnectable from a single side thereof according to claim 6 wherein the step of insertably mounting a pin in each of said apertures further comprises the steps of:

inserting said pin in each of said second aperture portions until said pin engages said inner side surface of said block of insulative material; and securing said pin inserted into each of said second aperture portions.

8. A method of manufacturing a channel array for an ink jet printhead interconnectable from a single side thereof, comprising the steps of:

providing a lower body portion formed of an insulative material and having top and bottom side surfaces, a plurality of generally parallel, longitudinally extending strips of conductive material formed along said top side surface, a corresponding plurality of conductive pins projecting from said bottom side surface and means for electrically connecting each of said plurality of pins with a corresponding one of said plurality of strips;

conductively mounting a bottom side surface of a first intermediate body portion to said top side surface of said lower body portion, said first intermediate body portion constructed of an active piezoelectric material poled in a first direction generally parallel to said lower body portion;

conductively mounting a bottom side surface of a second intermediate body portion to a top side surface of said first intermediate body portion, said second intermediate body portion constructed of an active piezoelectric material poled in a second direction, opposite to said first direction, generally parallel to said lower body portion;

forming, at spaced locations along a top side surface of said second intermediate body portion, a plurality of generally parallel, longitudinally extending grooves which extend through said second intermediate body portion to expose generally parallel, longitudinally extending portions of said top side surface of said lower body portion located between said strips of conductive material; and conductively mounting a bottom side surface of an upper body portion to said top side surface of said second intermediate body portion, said upper body portion formed of an insulative material.

9. A method of manufacturing a channel array for an ink jet printhead interconnectable from a single side thereof according to claim 8 and further comprising the steps of:

conductively mounting a bottom side surface of a third intermediate body portion to said top side surface of said first intermediate body portion, said third intermediate body portion formed of an inactive conductive material; and conductively mounting a top side surface of said third intermediate body portion to said bottom side surface of said second intermediate body portion.

10. A method of manufacturing a channel array for an ink jet printhead interconnectable from a single side thereof according to claim 8 and further comprising the step of forming said generally parallel, longitudinally extending grooves to extend through a portion of said lower body portion.

11. A method of manufacturing a channel array for an ink jet printhead interconnectable from a single side thereof, comprising the steps of:

providing a block of insulative material, said block of material having top and bottom side surfaces;

forming a plurality of apertures extending from said top side surface to said bottom side surface of said block of insulative material, each of said apertures being defined by an interior side surface and corresponding to one of said plurality of ink-carrying channels;

depositing conductive material on said interior side surfaces and on part of said top side surface of said block of insulative material, said conductive material on said top side surface being arranged into a plurality of generally parallel, longitudinally extending strips, each electrically isolated from the remaining strips and electrically connected with said conductive material deposited on said interior side surface defining one of said apertures;

insertably mounting a pin in each of said apertures formed in said block of insulative material, each said pin in electrical connection with one of said strips of conductive material arranged along said top side surface of said block of insulative material;

conductively mounting a bottom side surface of a first intermediate body portion to said top side surface of said block of insulative material, said first intermediate body portion constructed of an active piezoelectric material poled in a first direction generally parallel to said top side surface of said block of insulative material;

conductively mounting a bottom side surface of a second intermediate body portion to a top side surface of said first intermediate body portion, said second intermediate body portion constructed of an active piezoelectric material poled in a second direction, opposite to said first direction, generally parallel to said top side surface of said block of insulative material;

forming, at spaced locations along a top side surface of said second intermediate body portion, a plurality of generally parallel, longitudinally extending grooves which extend through said second intermediate body portion to expose generally parallel, longitudinally extending portions of said top side surface of said block of insulative material located between said strips of conductive material; and conductively mounting a bottom side surface of an upper body portion to said top side surface of said second intermediate body portion, said upper body portion formed of an insulative material.

12. A method of manufacturing a channel array for an ink jet printhead interconnectable from a single side thereof according to claim 11 wherein the step of depositing conductive material on part of said top side surface of said block of insulative material further comprises the steps of:

depositing a layer of conductive material on said top side surface of said block of insulative material; and removing a portion of said conductive material deposited on said top side surface of said block of insulative material such that the remaining conductive material is arranged as a series of generally parallel, longitudinally extending strips.

13. A method of manufacturing a channel array for an ink jet printhead interconnectable from a single side thereof according to claim 12 wherein the step of forming a plurality of apertures extending from said top side surface to said bottom side surface of said block of insulative material further comprises the steps of:

forming a first plurality of inwardly tapered aperture portions which extend from said top side surface to an inner surface of said block of insulative material; and forming a second, corresponding, plurality of inwardly tapered aperture portions which extend from said bottom side surface to said inner surface of said block of insulative material, said second plurality of aperture portions each having greater diameters than and being in communication with a corresponding one of said first plurality of aperture portions.

14. A method of manufacturing a channel array for an ink jet printhead interconnectable from a single side thereof according to claim 13 wherein the step of insertably mounting a pin in each of said apertures further comprises the steps of:

inserting said pin in each of said second aperture portions until said pin engages said inner side surface of said block of insulative material; and securing said pin inserted into each of said second aperture portions.

15. A method of manufacturing a channel array for an ink jet printhead interconnectable from a single side thereof according to claim 14 and further comprising the steps of:

conductively mounting a bottom side surface of a third intermediate body portion to said top side surface of said first intermediate body portion, said third intermediate body portion formed of an inactive conductive material; and conductively mounting a top side surface of said third intermediate body portion to said bottom side surface of said second intermediate body portion.

16. A method of manufacturing a channel array for an ink jet printhead interconnectable from a single side thereof according to claim 15 and further comprising the step of forming said generally parallel, longitudinally extending grooves to extend through a portion of said block of insulative material.

17. A method of manufacturing a channel array for an ink jet printhead interconnectable with an associated drive system from a single side thereof, comprising the steps of:

providing a lower body portion formed of an active piezoelectric material poled in a first, widthwise, direction and having a layer of conductive material formed on a top side surface thereof;

conductively mounting a bottom side surface of a intermediate body portion to said top side surface of said lower body portion, said intermediate body portion formed of an active piezoelectric material poled in a second, opposite, direction, parallel to said first direction;

forming, at spaced locations along a top side surface of said intermediate body portion, a plurality of generally parallel, longitudinally extending grooves which extend through said intermediate body portion and part of said lower body portion and which separate said intermediate body portion into a plurality of generally parallel, longitudinally extending sidewall actuators;

conductively mounting a bottom side surface of an upper body portion to a top side surface of said intermediate body portion to define a plurality of ink-carrying channels, said upper body portion having a plurality of generally parallel, longitudinally extending strips of conductive material formed along said bottom side surface thereof, each one of said plurality of conductive strips electrically connected to a corresponding one of said sidewall actuators, and means for electrically connecting each of said conductive strips to respective spaced locations on said top side surface.

18. A method of manufacturing a channel array for an ink jet printhead interconnectable with an associated drive system from a single side thereof, comprising the steps of:

providing a lower body portion formed of an insulative material and having a layer of conductive material formed on a top side surface thereof;

conductively mounting a bottom side surface of a first intermediate body portion to said top side surface of said lower body portion, said first intermediate body portion formed of an active piezoelectric material poled in a first direction generally parallel to said lower body portion;

conductively mounting a bottom side surface of a second intermediate body portion to a top side surface of said first intermediate body portion, said second intermediate body portion formed of an active piezoelectric material poled in a second direction, opposite to said first direction, generally parallel to said top side surface of said lower body portion;

forming, at spaced locations along a top side surface of said second intermediate body portion, a plurality of generally parallel, longitudinally extending grooves which extend through said first and second intermediate body portions to expose said layer of conductive material formed on said top side surface of said lower body portion, thereby separating said first and second intermediate body portion into a plurality of generally parallel, longitudinally extending sidewall actuators;

conductively mounting a bottom side surface of an upper body portion to a top side surface of said intermediate body portion to define a plurality of ink-carrying channels, said upper body portion having a plurality of generally parallel, longitudinally extending strips of conductive material formed along said bottom side surface thereof, each one of said plurality of conductive strips electrically connected to a corresponding one of said sidewall actuators, and means for electrically connecting each of said conductive strips to respective spaced locations on said top side surface.

* * * * *